United States Patent [19]

Sakakura et al.

[11] 4,233,135
[45] Nov. 11, 1980

[54] METHOD OF FABRICATING PIEZOELECTRIC THIN FILM

[75] Inventors: Mitsuo Sakakura, Saitama; Tetsuo Takaku, Tsurugashima, both of Japan

[73] Assignee: Toko, Inc., Saitama, Japan

[21] Appl. No.: 12,536

[22] Filed: Feb. 15, 1979

[30] Foreign Application Priority Data

Feb. 27, 1978 [JP] Japan .................... 53-2176878

[51] Int. Cl.$^2$ ............................................. C23C 15/00
[52] U.S. Cl. ........................... 204/192 SP; 252/62.9
[58] Field of Search ............. 204/192 C, 192 SP; 252/62.9 R; 427/100

[56] References Cited

U.S. PATENT DOCUMENTS

| | | | |
|---|---|---|---|
| 3,409,464 | 11/1968 | Shiozawa | 117/201 |
| 3,566,185 | 2/1971 | Gavin | 315/111 |
| 3,766,041 | 10/1973 | Wasa et al. | 204/192 |
| 4,139,678 | 2/1979 | Ogawa et al. | 428/432 |

OTHER PUBLICATIONS

Toshio Hada, Structures and Electrical Properties of Zno Films prepared by Low Pressure Sputtering Systems, Thin Solid Films, vol. 7, No. 2, (1971), pp. 135–145.

B. T. Khuri-Yakub et al.; Studies of the Optimum Conditions for Growth of RF-Sputtered ZnO Films; Journal of Applied Physics, vol. 46, No. 8, (8/1975), pp. 3266–3272.

*Primary Examiner*—John H. Mack
*Assistant Examiner*—William Leader
*Attorney, Agent, or Firm*—Schwartz, Jeffery, Schwaab, Mack, Blumenthal & Koch

[57] ABSTRACT

In a method of fabricating a piezoelectric thin film of zinc oxide by means of a sputtering process, zinc and alkaline earth metal are sputtered together in an oxygen atmosphere to thereby produce zinc oxide containing the alkaline earth metal.

4 Claims, 2 Drawing Figures

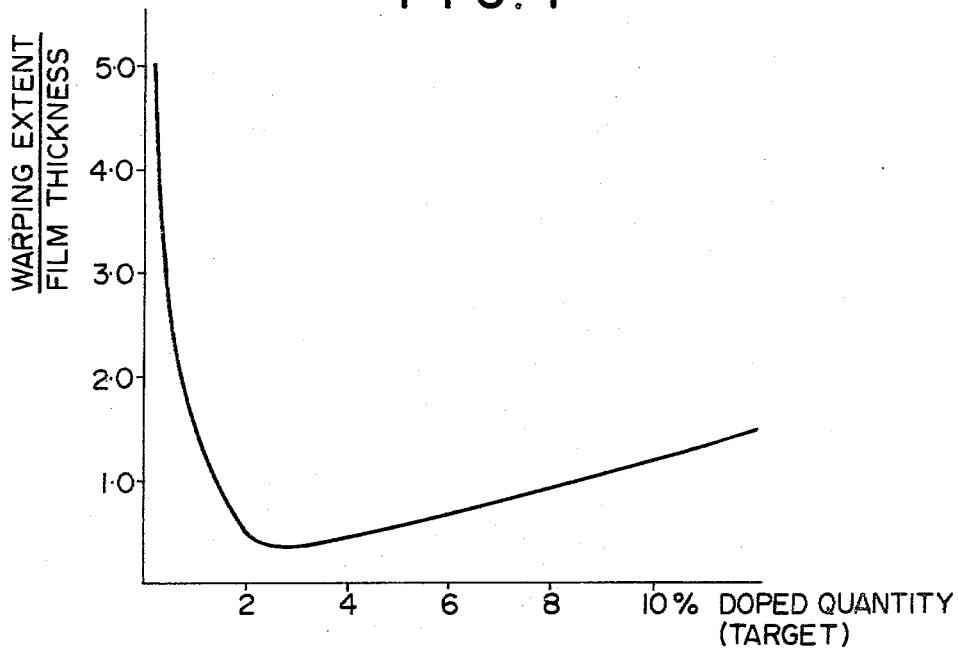
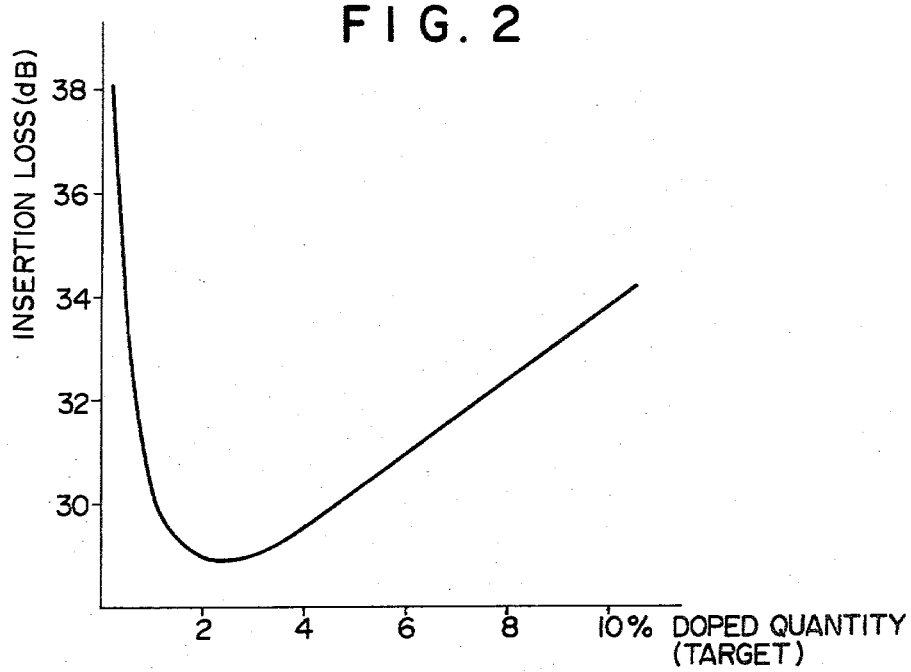

METHOD OF FABRICATING PIEZOELECTRIC THIN FILM

The present invention relates to a method of fabricating piezoelectric thin films which can be employed to make elastic surface wave elements or the like.

Elastic surface wave element is an element in which input and output electrodes, which are formed by interdigital electrodes, are provided on a substrate formed of a piezoelectric material, thereby effecting electro-mechanical and mechanical-electric signal conversions. Such elements have been used as filters, delay lines and so forth through utilization of the frequency characteristics and delay time characteristics thereof.

The piezoelectric materials which have been employed as materials for elastic surface wave elements at present may be classified into the following three categories: Monocrystal of lithium niobate or the like; piezoelectric ceramic such as PZT (trade mark of Vernitron Corporation, U.S.A.) or the like; and piezoelectric thin film of zinc oxide or the like. However, each of these materials has merits and demerits. More specifically, monocrystalline piezoelectric materials have such disadvantages that the cost thereof is high and the dependence on temperature of the velocity of elastic surface wave propagating therealong is remarkable; piezoelectric ceramics are disadvantageous in that irregularities occur in the material constants thereof and that the frequency range is limited; and piezoelectric thin films are disadvantageous in that difficulties are encountered in an attempt to accurately control the thickness thereof.

Though the respective materials have such demerits as mentioned just above, it is considered that piezoelectric thin films are the most useful materials, from the standpoint of cost, maintenance of characteristics and available frequency range. Piezoelectric thin films may be formed not only by zinc oxide but also cadmium sulfate or the like; however, it is zinc oxide that is considered most suitable from the standpoint of safety and coupling coefficient.

In elastic surface wave elements using a piezoelectric thin film of zinc oxide, it is the usual practice that such a thin film is provided on a substrate of an insulating material such as glass which has interdigital electrodes provided thereon. The piezoelectric thin film is formed by vapor-depositing zinc oxide onto the glass substrate. There are available several methods for producing a thin film of zinc oxide by means of vapor-deposition, and most commonly used one of such methods is a sputtering method.

Among various types of sputtering processes which have heretofore been proposed is the two-pole DC sputtering process in which argon and oxygen gases are introduced into a highly evacuated bell jar as inert gas and active gas respectively, an anode is provided which has a substrate of an insulating material such as glass mounted thereon, and a cathode is provided which has a target of zinc mounted thereon. In such a process, a DC electric field is applied between the anode and the cathode to produce a plasma discharge by which the argon gas is ionized to make $Ar^+$ which in turn is permitted to collide with the cathode. Such collision results in sputtering effect by which zinc molecules will be driven out into the bell jar. Such molecules of zinc will be caused to react with the oxygen activated in the plasma discharge, so that zinc oxide will be produced which in turn will be caused to adhere to the substrate of the anode, thus resulting in crystal being grown.

In order to ensure that an elastic surface wave element has a sufficient conversion efficiency, it is necessary to sufficiently increase the electric-mechanical coupling coefficient of the zinc oxide thin film used therewith. To this end, the thickness of such a film should be made to have a greater magnitude than a predetermined one. In the case of an elastic surface wave element to be used as 58 MHz VIF filter for color television, for example, such film thickness should be of about 20 $\mu$m in order to increase the electric-mechanical coupling coefficient to thereby decrease insertion loss.

In the case where a thin film of zinc oxide having a thickness of 20 $\mu$m was vapor-deposited on a glass substrate, however, such a situation occurred that the glass substrate was damaged. Moreover, there also occurred a situation that the thin film of zinc oxide peeled off the glass substrate instead of the latter being fractured. Such two situations were selectively caused by changing the oxygen pressure during the manufacturing steps in the sputtering process.

Accordingly, it is an object of the present invention to provide a piezoelectric thin film which does not cause a glass substrate to be damaged when the piezoelectric thin film is formed thereon as a film of a thickness greater than 20 $\mu$m.

Another object of the present invention is to provide a piezoelectric thin film of zinc oxide which neither causes a glass substrate to be damaged nor peels off the glass substrate.

Still another object of the present invention is to provide a piezoelectric thin film of zinc oxide with a sufficient electric-mechanical coupling coefficient.

Other objects, features and advantages of the present invention will become apparent from the ensuing explanation.

FIG. 1 is a graph illustrating the relationship between the quantity of doped beryllium and the extent to which the glass substrate is warped.

FIG. 2 is a graph illustrating the relationship between the quantity of doped beryllium and the insertion loss.

The causes for the above-mentioned problems may be considered to reside in the crystal structure of a zinc oxide thin film. In zinc oxide, oxygen and zinc are bonded together through covalent bond (II-VI bond) with a strong ionic nature, and its crystal structure is of the hexagonal system. That is, the zinc and oxygen array planes are perpendicular to the C-axis and are alternately arranged along the C-axis so as to represent a wurtz type structure. Thus, zinc and oxygen are arranged in alternate planes on a common straight line perpendicular to the C-axis. When a zinc oxide thin film is formed by a sputtering process, a pillar-like crystal is caused to grow in a direction perpendicular to the glass substrate surface. This direction of growth coincides with the C-axis.

A comparison of the oxygen planes and the zinc planes in the crystal structure indicates that the spacing between the oxygen planes is greater than that between the zinc planes so that as the zinc oxide thin film layer builds up, the oxygen planes and the zinc planes become deviated from each other in terms of positional relationship therebetween. It may be considered that such a deviation causes oxygen in the sputtering atmosphere to enter the crystal of zinc oxide, whereby the crystal structure is deteriorated. In other words, by the fact that excess oxygen molecules are caused to enter the crystal, the aforementioned arrangements of zinc and oxygen are disturbed, which will have a detrimental influence on the crystal growing direction, i.e., orientation of the C-axis. Thus, the crystal growing direction will become oblique and irregular with respect to the surface of the glass substrate rather than perpendicular with respect thereto. As the result of investigations of fractured glass substrates, it has been observed that in some of such substrates, the crystal growing direction has become irregular and that the substrates have been fractured at the points where the crystal has grown irregularly.

By regarding that the crystal structure is deteriorated due to distortion occurring in the crystal of zinc oxide so that an internal stress is caused to occur therein and applied to the glass substrate whereby the latter is fractured, the problems which have heretofore been encountered can best be explained. When the thickness of a zinc oxide thin film is about 3 $\mu$m, such an internal stress is so low that there occurs no distortion great enough to cause the substrate to be fractured, whereas when such a thickness is made as great as 20 $\mu$m, the internal stress builds up to such an extent that the glass substrate connot withstand it. In fact, it has been observed that glass substrates on which a zinc oxide thin film was vapor-deposited, were warped. Such a stress as mentioned above tends to concentrate at the points where the crystal structure has been deteriorated, and thus the glass substrates are particularly liable to be fractured at such points.

Glass substrates 0.5 to 0.75 mm thick are usually employed. However, such glass substrates should be as thin as possible since if use is made of a glass substrate having a greater thickness to secure a sufficient strength, then not only will the element become bulky but also will working such as cutting become difficult. In addition, it is desirable that the internal stress tending to occur in the zinc oxide thin film be reduced by means of improvements in the crystal structure per se.

By reducing the quantity of oxygen in the sputtering atmosphere in an attempt to prevent occurrence of internal stress such as mentioned above, the adherence of the zinc oxide thin film to the glass substrate was weakened so that the thin film became liable to peel off the glass substrate. In such a case, it has been found that the crystal of the zinc oxide thin film has become liable to be subject to cleavage so that the bond in the direction of the C-axis has been weakened. It may be considered that the reason for this is such that zinc molecules are caused to enter the zinc oxide thin film. If the quantity of zinc contained in a zinc oxide thin film is excessive, then the resistivity of the zinc oxide thin film is decreased; thus, it is likely that the piezoelectric properties of the thin film become deteriorated.

By changing the conditions for sputtering, the crystal structure of zinc oxide thin film which is permitted to grow on a glass substrate, is slightly changed. However, in order to achieve an enhanced productivity while securing characteristics which make the zinc oxide thin film usable for an elastic surface wave element, the structure of the thin film per se should be changed by doping some other substance or substances into the thin film.

In view of what has been mentioned just above, the inventors have made researches and investigations to seek substances which are suitable to be doped, and as a result found out that beryllium is most suitable. Beryllium is of divalence as electrically viewed and hence directly combines with oxygen to form an oxide. Zinc is also of divalence as electrically viewed; thus, beryllium can be substituted for zinc in crystal of zinc oxide and solid-dissolved therein.

In order to permit beryllium to be substituted for zinc in a zinc oxide thin film and solid-dissolved therein, zinc of a cathode is sputtered as in a sputtering process, while at the same time the beryllium is sputtered to be deposited onto the substrate of an anode. To this end, the cathode may be provided either with a target formed by an alloy of zinc and beryllium or separate targets which are formed by zinc and beryllium respectively. It has been found, however, that a desired zinc oxide thin film can also be produced by effecting sputtering through use of a simple construction in which beryllium is merely embedded in a hole or holes formed in a zinc target.

Upon occurrence of a plasma discharge, argon gas is thereby ionized, and the resultant ions collide with the target of the cathode. Consequently, the zinc and beryllium are driven out into the bell jar by sputtering effect. In turn, the zinc and beryllium thus driven out are permitted to combine with oxygen and deposited on the substrate, thus resulting in crystal being grown. in such a case, the quantity of the beryllium is selected to be very small as compared with the quantity of zinc; hence, the film which is formed on the glass substrate by the sputtering method consists substantially of zinc oxide except that the beryllium is substituted for part of the zinc molecules in the thin film and solid-dissolved therein. In this way, the zinc oxide thin film thus produced contains a small quantity of beryllium.

Beryllium is of divalence like zinc as mentioned above, and therefore strongly combines with oxygen. That is, the thus resulting oxide exhibits a strong ionic bond as the so-called II-IV compound. Thus, the beryllium which has been substituted for part of the zinc in the zinc oxide thin film and solid-dissolved therein is in the same bonded state as the zinc.

With a zinc oxide thin film grown on a glass substrate by sputtering beryllium along with zinc, the glass substrate was never fractured due to the formation of the thin film thereon even when such a film was as thick as 20 $\mu$m. The reason for this may be considered to be such that stress occurring in the zinc oxide thin film was reduced as a consequence of the beryllium being substituted for part of the zinc in the film and solid-dissolved therein by being sputtered along with the zinc. In fact, the crystal structure of a zinc oxide thin film which contains beryllium and which is formed by sputtering the beryllium along with zinc, is not yet known. The only thing that is conceivable at the present time is that with a prior-art zinc oxide thin film, oxygen excessively present therein acted to put the zinc and oxygen arrangements into disorder whereas with the zinc oxide thin film produced according to the present invention, the quantity of such oxygen is so reduced that formation of normal zinc and oxygen arrangements is promoted. In other words, it may be considered that with the present thin film, the beryllium is present therein in such a form as to compensate the difference between the oxygen plane spacing and the zinc plane spacing and acts to control the crystal structure of the zinc oxide thin film so as to prevent the difference from exceeding a certain extent.

It has been confirmed also from warping of the glass substrates in use that the zinc oxide thin films produced according to the present invention possess an improved crystal structure wherein the internal stress such as mentioned earlier is reduced. It has also been observed that such a warping is reduced as the quantity of beryllium doped is increased, as can be seen from FIG. 1.

Zinc oxide is a piezoelectric substance constituting the II-VI compound. That a piezoelectric substance represents improved piezoelectric properties means that the resistivity thereof is high. When substituted for part of the zinc in a zinc oxide thin film, beryllium takes the same form of bond as zinc since the beryllium is of divalence like zinc; thus, the piezoelectric properties of the thin film will never be deteriorated. That is, when such substitution is effected, neither free electrons nor holes are generated so that the high resistivity can be maintained. It may rather be considered that the resistivity can be incresed by the fact that the quantity of excess oxygen molecules in the thin film of zinc oxide is reduced.

It has also been confirmed that the following improvements in terms of piezoelectric properties can be achieved according to the present invention: That the piezoelectric properties of a piezoelectric substance are good means that the electric-mechanical coupling coefficient or conversion efficiency thereof is high. This is reflected in the fact that an elastic surface wave element using such a piezoelectric substance has a low insertion loss, as viewed from the standpoint of the characteristics of such an element. With an elastic surface wave element using a zinc oxide formed by doping 6% beryllium, the insertion loss was reduced by 4 dB, that is, from 35 dB to 31 dB, as can be seen from FIG. 2. It is particularly to be noted that according to the present invention, the piezoelectric properties of a zinc oxide thin film can even be improved rather than being merely prevented from suffering deterioration. However, the quantity of beryllium to be doped should desirably be minimized since alkaline earth metal oxide is inferior to zinc oxide in terms of piezoelectric properties.

That improved piezoelectric properties of a zinc oxide thin film can be achieved means that the thickness thereof can be reduced so that the time required for producing such a thin film can be shortened.

The result of the experiments conducted with calcium and beryllium doped shows that the present invention is sufficiently effective so that intimate adherence of the zinc oxide thin film to the glass substrate can be achieved.

Though the crystal structure of a zinc oxide thin film containing beryllium is not yet completely elucidated, it may be considered that the ion radius of the respective element and the crystal structure of a zinc oxide thin film containing such an element have correlation with each other and therefore that the optimum doping quantity differs from one element to another. It has been experimentally observed that a satisfactory result can be produced as far as such a quantity is within the range between 1 atom % to 10 atom %.

In the foregoing explanation, the quantity of beryllium was indicated in terms of the quantity doped in the target; it has been found out that the quantity of beryllium contained in the resultant thin film represents approximately the same percentage as that of the quantity doped in the target. Specifically, with the target containing 1 atom % of beryllium, about 1 atom % of beryllium was contained in the resultant thin film, and with the target containing 10 atom % of beryllium, about 10 atom % of beryllium was contained in the thin film.

It has been found that the velocity of elastic surface wave varies depending on the quantity of the doped alkaline earth metal when the zinc oxide thin film produced according to the present invention is used for an elastic surface wave element. The velocity of elastic surface wave was about 2590 m/sec. when no doping was effected, but when beryllium was doped, such velocity increased substantially linearly as the quantity of doped beryllium was increased, that is, about 2615 m/sec. for the case where 2% berillium was doped, about 2640 m/sec. for the case where 4% beryllium was doped, and so on. That the velocity increases means that the frequency increases. The center frequency as computed between the electrodes was increased by 0.7 MHz for the example wherein beryllium was used.

By utilizing the aforementioned phenomena, it is possible to control the frequency characteristics on the basis of the type of dopant and quantity thereof. When an elastic surface wave element using the zince oxide thin film according to the present invention is to be employed at a particularly high frequency, the electrode pitch thereof can be broadened, which provides for an advantage in respect of facilitating design and manufacture of the electrodes for such an element.

In forming a zinc oxide thin film in accordance with the present invention, the desired effects have been produced by doping 1 atom % to 10 atom % of beryllium in a target. In other words, when the quantity of beryllium contained in the resultant zinc oxide thin film is in the range of from 1 atom % to 10 atom %, such a thin film has turned out to be a preferred one.

Zinc oxide thin films produced according to the present invention are also very stable from the chemical standpoint and subject to no deterioration due to aging; thus, by using such thin films, it is possible to obtain highly reliable elements.

Although this invention was been described with respect to some specific examples, it is to be understood that the invention is not restricted thereto but covers any and all modifications and changes which may be made within the scope of the appended claims.

We claim:

1. A method of fabricating a piezoelectric thin film of zinc oxide by means of a sputtering process, characterized by sputtering zinc and beryllium together in an oxygen atmosphere to thereby produce a thin film of zinc oxide containing 1 to 10 atom % of beryllium.

2. A method according to claim 1, characterized by using a cathode provided with separate targets which are formed by zinc and beryllium respectively, and causing the zinc and beryllium targets to be sputtered together to thereby produce a thin film of zinc oxide containing 1 to 10 atom % of beryllium.

3. A method according to claim 1, characterized by using a cathode provided with a target formed of zinc mingled with beryllium, and causing said target to be sputtered to thereby produce a thin film of zinc oxide containing 1 to 10 atom % of beryllium.

4. A method according to claim 1, characterized by using a cathode provided with a target formed of zinc mingled with 1 to 10 atom % of beryllium, and causing said target to be sputtered to thereby produce a zinc oxide thin film containing 1 to 10 atom % beryllium.

* * * * *